(12) United States Patent
Lo et al.

(10) Patent No.: US 8,449,153 B2
(45) Date of Patent: May 28, 2013

(54) LED MODULE

(75) Inventors: Hsing-Fen Lo, Hsinchu (TW); Chih-Hsun Ke, Hsinchu (TW); Shiun-Wei Chan, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 109 days.

(21) Appl. No.: 13/224,341

(22) Filed: Sep. 2, 2011

(65) Prior Publication Data
US 2012/0127742 A1    May 24, 2012

(30) Foreign Application Priority Data
Nov. 19, 2010    (CN) ............ 2010 1 0552072

(51) Int. Cl.
*F21V 33/00*    (2006.01)

(52) U.S. Cl.
USPC .......................... 362/382; 362/97.1; 362/373

(58) Field of Classification Search
CPC ... F21V 29/004; F21V 19/0015; H01H 59/009; H01H 25/008
USPC .......................... 362/382, 373, 97.1
See application file for complete search history.

(56) References Cited

U.S. PATENT DOCUMENTS

| | | | |
|---|---|---|---|
| 6,614,103 B1* | 9/2003 | Durocher et al. | 257/678 |
| 2008/0258171 A1* | 10/2008 | Tsukagoshi | 257/100 |
| 2011/0255030 A1* | 10/2011 | Pei | 349/62 |

* cited by examiner

Primary Examiner — Tracie Y Green
(74) Attorney, Agent, or Firm — Altis Law Group, Inc.

(57) ABSTRACT

An LED module includes a substrate comprising a base plate and an elastic arm extending from a periphery side of the base plate. The elastic arm includes a horizontal portion parallel to and spaced from the base plate. A receiving space is defined between the horizontal portion of the elastic arm and the base plate. A circuit layer is formed on the base plate. An LED is mounted on the base plate and electrically connects with the circuit layer. The LED comprises a base and at least one electrode extending outwardly from the base. The LED is fixed on the substrate via the at least one electrode slideably received in the receiving space with a downward force applied on the electrode by the horizontal portion of the elastic arm.

14 Claims, 3 Drawing Sheets

LED MODULE

BACKGROUND

1. Technical Field

The present disclosure relates to light source modules, and particularly to an LED (light emitting diode) module which can be assembled and disassembled conveniently.

2. Description of the Related Art

A typical LED lightbar includes a PCB (Printed Circuit Board) and a plurality of LEDs disposed on the PCB. The PCB includes a circuit formed thereon. Each of the LEDs is electrically connected to the circuit of the PCB by soldering.

Since the LEDs are fixedly affixed to the PCB by soldering, when one of the LEDs is damaged, the whole lightbar needs to be replaced because the damaged LED can not be detached from the lightbar easily, which results in a great waste.

Therefore, it is desirable to provide an LED module which can overcome the described limitations.

DETAILED DESCRIPTION

Embodiments of an LED module as disclosed are described in detail here with reference to the drawings.

Figure 1:
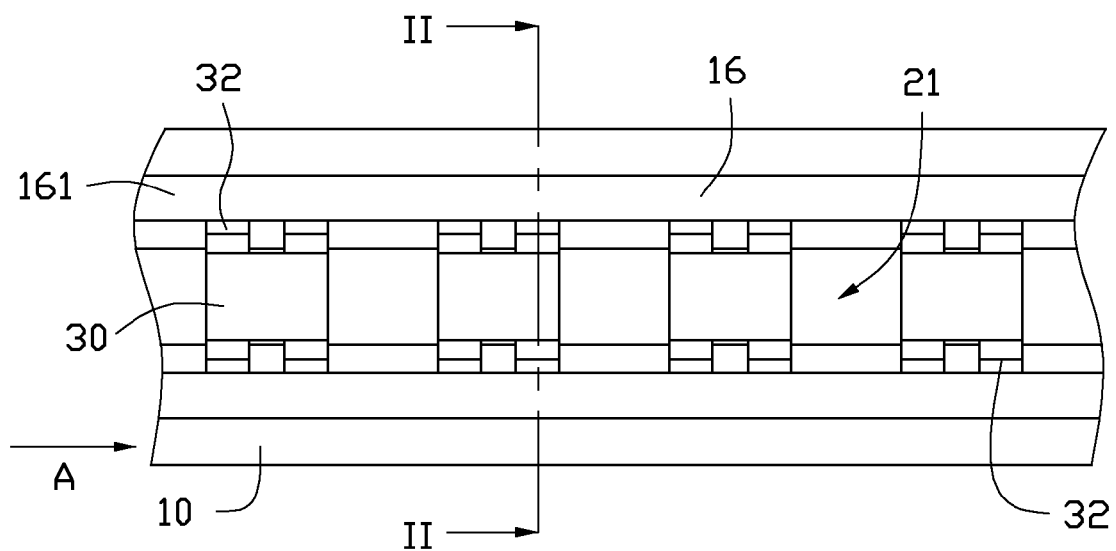
FIG. 1 is a schematic, fragmentary top view of an LED module in accordance with an exemplary embodiment of the present disclosure.
Figure 2:
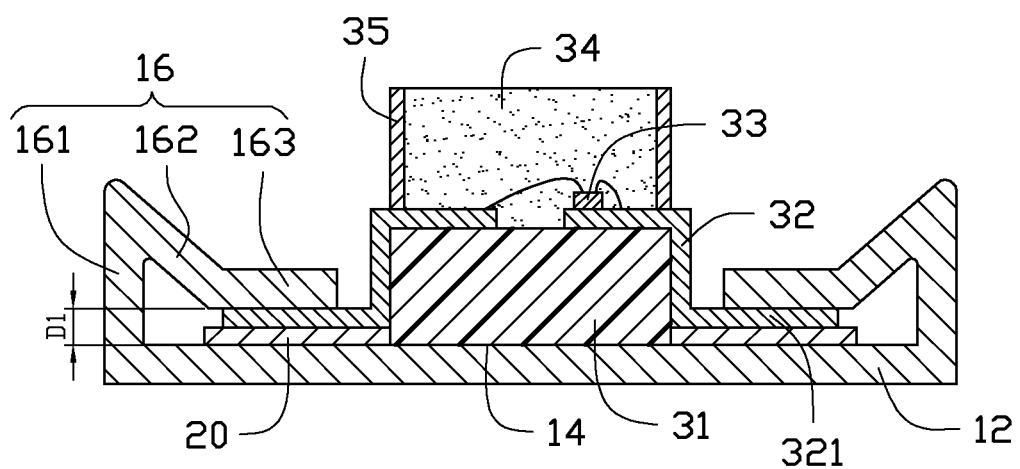
FIG. 2 is a schematic, cross-sectional view of the LED module of FIG. 1, taken along line II-II thereof.

Referring to FIGS. 1 and 2, an LED module according to an exemplary embodiment is shown. The LED module includes a substrate 10, a circuit layer 20 formed on the substrate 10, and a plurality of LEDs 30 mounted on the substrate 10 and electrically connecting with the circuit layer 20.

Figure 3:
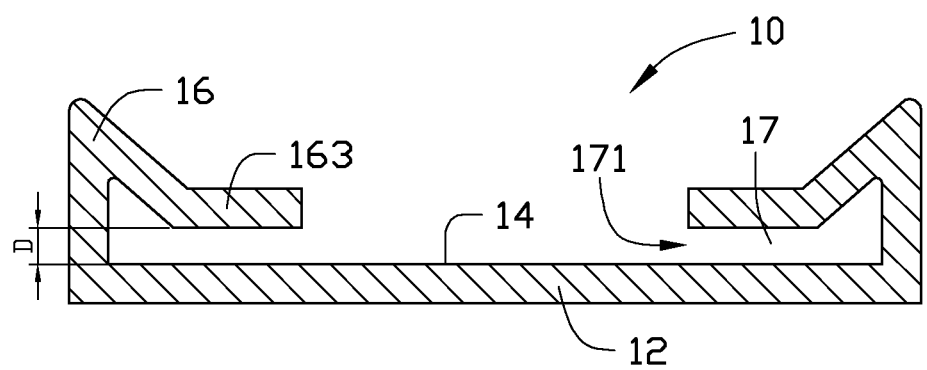
FIG. 3 is a view similar to FIG. 2, showing a substrate of the LED module.

Referring also to FIG. 3, the substrate 10 is elongated, and includes a base plate 12 and two elastic arms 16 extending from the base plate 12. The base plate 12 is substantially rectangular, and includes a flat upper surface 14. Each of the elastic arms 16 includes a vertical portion 161 extending upwardly and perpendicularly from a corresponding long side of the base plate 12, an inclined portion 162 bent inwardly and slantwise downwards from a top end of the vertical portion 161 and a horizontal portion 163 extending inwardly and horizontally from a distal end of the inclined portion 162. The elastic arms 16 each are elongated. The horizontal portion 163 of each of the elastic arms 16 is spaced from and parallel to the flat upper surface 14 of the base plate 12, with a receiving space 17 defined therebetween. A height of the receiving space is D. The substrate 10 is made of material with good elasticity, such as metal or alloy. The receiving space 17 defines an inlet 171 at an inner end thereof. The inlet 171 communicates with an outer environment via three sides of the horizontal portion 163. The height D will be increased when the horizontal portion 163 of the elastic arm 16 is pulled upwardly.

The circuit layer 20 is formed on the upper surface 14 of the substrate 10. In this embodiment, the circuit layer 20 is film-shaped, and defines a cutout 21 in a middle thereof. The cutout 21 separates the circuit layer 20 into two separated portions which are located at two opposite sides of the cutout 21, respectively. Due to the present of the cutout 21, a part of the upper surface 14 of the substrate 10 is exposed for the LEDs 30 mounted thereon. Alternatively, the circuit layer 20 can be designed as being continuously extended without the cutout 21, and the LEDs 30 are directly mounted on the circuit layer 20. The circuit layer 20 can be formed on the substrate 10 by sputtering, electroplating, electroforming, deposition or other related known methods. In an alternative embodiment, the circuit layer 20 can be a MCPCB (Metal Core PCB (Printed Circuit Board)) which includes a metal plate and circuit wires formed in the metal plate to provide a good heat dissipation for the LEDs 30. In another alternative embodiment, the circuit layer 20 can be a traditional PCB.

Each of the LEDs 30 includes a base 31, a pair of electrodes 32 formed on the base 31, an LED chip 33 mounted on one of the electrodes and electrically connected with the electrodes 32 via a pair of metal wires (not labeled), a casing 35 surrounding the LED chip 33 and located on the electrodes 32, and an encapsulation 34 received in the casing 35 for encapsulating the LED chip 33 therein. The LEDs 30 are mounted on the part of the upper surface 14 of the base plate 12 which is exposed between the two separated portion of the circuit layer 20, with two opposite sides of the base 31 abutting against the two separated portions of the circuit layer, respectively. The electrodes 32 are spaced from each other and located at left and right sides of base 31, respectively. Each of the electrodes 32 is about Z-shaped, and includes an extending foot 321. The extending feet 321 extend from two opposite sides of the base 31 along opposite directions away from each other. Each of extending feet 321 is used to contact a corresponding separated portion of the circuit layer 20 when the LED 30 is mounted on the base plate 12, such that the LED 30 is electrically connected to the circuit layer 20 via the electrodes 32.

When the LED 30 is mounted on the base plate 12, the base 31 is received in the cutout 21 of the circuit layer 20 with the extending feet 321 of the electrodes 32 located under the horizontal portions 163 of the elastic arms 16, respectively. The extending feet 321 and the circuit layer 20 are stacked together and sandwiched between the horizontal portions 163 of the elastic arms 16 and the base plate 12. The height D between the elastic arms 16 and the base plate 12 is slightly smaller than a sum of thicknesses of the electrode 32 and the circuit layer 20. Thus, when the LED 30 is mounted on the substrate 10 with the extending feet 321 of the electrodes 32 sandwiched between the horizontal portions 163 of the elastic arms 16 and the circuit layer 20, the elastic arms 16 are deformed by the insertion of and engaging with the extending feet 321 of the electrodes 32, whereby a downward pressing force is applied on the extending feet 321 of the electrodes 32 by the horizontal portions 163 to cause the extending feet 321 to have a tight engagement with the circuit layer 20. At this state, the distance D1 between the horizontal portions 163 of the elastic arms 16 and the base plate 12 is substantially equal to the sum of the thicknesses of the electrodes 32 and the circuit layer 20, which is larger than the height D of the space 17. Thus, the horizontal portions 163 can tightly clip the LED 30 between the base plate 12 and the elastic arms 16 of the substrate 10. Accordingly, the LEDs are assembled to the substrate 10 easily.

The LED 30 can also be conveniently withdrawn from the substrate 10 by sliding the LED 30 along a lengthwise direction of the substrate 10 until the LED 30 is totally separated from the elastic arms 16 of the substrate 10. Accordingly, the LED 30 can be inserted into or withdrawn from substrate 10 from a side of the elastic arms 16, thereby increasing the convenience of installation and removal of the LED 30. By this, a replacement of a damaged LED 30 can be easily achieved. In addition, the LED module can easily achieve various illumination intensities and temperature colors by increasing or decreasing the number of the LEDs contained in the LED module or replacing the exited LEDs with different LEDs having different colors or lumens.

It is to be further understood that even though numerous characteristics and advantages have been set forth in the foregoing description of embodiments, together with details of the structures and functions of the embodiments, the disclosure is illustrative only; and that changes may be made in detail, especially in matters of shape, size, and arrangement of parts within the principles of the disclosure to the full extent indicated by the broad general meaning of the terms in which the appended claims are expressed.

What is claimed is:

1. An LED module, comprising:
   a substrate comprising a base plate and an elastic arm extending from a periphery side of the base plate, the elastic arm comprising a horizontal portion parallel to and spaced from the base plate, a receiving space defined between the horizontal portion of the elastic arm and the base plate;
   a circuit layer formed on the base plate;
   an LED mounted on the base plate and electrically connected with the circuit layer, the LED comprising a base on the base plate and at least one electrode extending outwardly from the base, the LED being fixed on the substrate via the at least one electrode slideably received in the receiving space with a downward force applied on the at least one electrode by the horizontal portion of the elastic arm.

2. The LED module as claimed in claim 1, wherein a distance between the horizontal portion of the elastic arm and the base plate is smaller than a sum of thicknesses of the at least one electrode and the circuit layer when the LED is separated from the substrate.

3. The LED module as claimed in claim 1, wherein the receiving space defines an opening communicated with an outer environment via three sides of the horizontal portion of the elastic arm.

4. The LED module as claimed in claim 1, wherein the circuit layer defines a cutout at a middle portion thereof and is separated into two separated portions by the cutout, the LED being located between the two separated portions.

5. The LED module as claimed in claim 4, wherein the LED is received in the cutout with two opposite sides of the base abutting against the two separated portions of the circuit layer.

6. The LED module as claimed in claim 5, wherein the at least one electrode comprises two electrodes, the two electrodes comprising extending feet extending from two opposite sides of the base along opposite directions away from each other, the extending feet contacting the two separated portions of the circuit layer, respectively, when the LED is mounted on the base plate.

7. The LED module as claimed in claims 1, wherein the elastic arm further comprises a vertical portion extending upwardly from the periphery side of the base plate and an inclined portion bent inwardly and slantwise from the vertical portion, the horizontal portion extending from a distal end of the inclined portion.

8. The LED module as claimed in claims 1, wherein the at least one electrode comprises an extending portion extending from a corresponding side of the base along a direction away from the base, the extending portion and the circuit layer being sandwiched between the horizontal portion of the elastic arm and the base plate.

9. An LED module, comprising:
   a substrate comprising a pair of elastic arms extending from two opposite periphery sides of the substrate, each of the elastic arms comprising a horizontal portion spaced from and parallel to the substrate, a receiving space defined under each of the horizontal portions, the receiving space defining an opening at one end thereof which is communicated with an external environment via three sides of the horizontal portion;
   a circuit layer formed on the substrate;
   an LED mounted on the substrate and electrically connected with the circuit layer, the LED comprising a base and a pair of electrodes extending outwardly from the base, the LED being fixed on the substrate via the electrodes respectively sandwiched between the horizontal portions of the elastic arms and the substrate, wherein to separate the LED from the substrate, the LED is moved to slid along a lengthwise direction of the substrate until the electrodes escape from the horizontal portions of the elastic arms.

10. The LED module as claimed in claim 9, wherein a distance between each of the horizontal portions of the elastic arms and the substrate is smaller than a sum of thicknesses of each of the electrodes and the circuit layer when the LED is separated from the substrate.

11. The LED module as claimed in claim 9, wherein the circuit layer defines a cutout at a middle portion thereof and is separated into two separated portions by the cutout, the LED being located between the two separated portions.

12. The LED module as claimed in claim 10, wherein the LED is received in the cutout with two opposite sides of the base abutting against the two separated portions of the circuit layer.

13. The LED module as claimed in claim 9, wherein each of the elastic arms further comprises a vertical portion extending upwardly from a corresponding periphery side of the base plate and an inclined portion bent inwardly and slantwise from the vertical portion, the horizontal portion extending from a distal end of the inclined portion.

14. An LED module, comprising:
   an LED comprising a chip and two electrodes electrically connecting with the chip;
   an elongated substrate comprising a base plate supporting the LED thereon and two elastic arms extending from opposite sides of the base plate towards each other;
   a circuit layer formed on the base plate and located under the elastic arms, a receiving space being defined between the circuit layer and each elastic arm with a height of the receiving space less than a thickness of each of the electrodes plus a thickness of the circuit layer when the elastic arms are not deformed and in their natural state, the two electrodes being respectively inserted in the receiving spaces to cause of the elastic arms to deform, thereby the elastic arms applying an elastic force on the electrodes to force the electrodes to contact the circuit layer closely.

* * * * *